Jan. 25, 1966 L. E. COERVER 3,231,832

CONICAL-CAVITY NEGATIVE RESISTANCE OSCILLATOR HAVING FLEXIBLE DIAPHRAGM FOR TUNING

Filed July 25, 1963 4 Sheets-Sheet 1

INVENTOR.
LEO E. COERVER,
BY J. K. Haskell
ATTORNEY.

INVENTOR.
LEO E. COERVER,
BY J. K. Haskell
ATTORNEY.

INVENTOR.
LEO E. COERVER,
BY J. K. Haskell
ATTORNEY.

Jan. 25, 1966 L. E. COERVER 3,231,832
CONICAL-CAVITY NEGATIVE RESISTANCE OSCILLATOR
HAVING FLEXIBLE DIAPHRAGM FOR TUNING
Filed July 25, 1963 4 Sheets-Sheet 4

INVENTOR.
LEO E. COERVER,
BY J. K. Haskell
ATTORNEY.

United States Patent Office 3,231,832

Patented Jan. 25, 1966

3,231,832

CONICAL-CAVITY NEGATIVE RESISTANCE OSCILLATOR HAVING FLEXIBLE DIAPHRAGM FOR TUNING

Leo E. Coerver, Santa Ana, Calif., assignor to Hughes Aircraft Company, Culver City, Calif., a corporation of Delaware Filed July 25, 1963, Ser. No. 297,552
4 Claims. (Cl. 331—107)

This invention relates to a negative resistance oscillator and more particularly to a tunable negative resistance oscillator structure which provides for tuning of a conical cavity with a minimum of variation in loading.

Negative resistance oscillators utilize an element exhibiting what is known as a negative resistance over at least part of their operating voltage range. The first practical semiconductor negative resistance element to be developed is the well known tunnel diode. This type of diode can be described as a heavily doped p-n junction that exhibits an incremental negative resistance at a small forward direct current (D.C.) bias voltage.

Through intensive research, improved and practical tunnel diodes are now commercially available and allow the design of oscillators operating in the frequency range from near D.C. to 10,000 megacycles (10 kmc.) and higher.

The theoretical and operational characteristics of tunnel diodes are well known in the electronics art and will not be presented here. However, reference may be made in this regard to published articles such as "Tunnel-Diode Microwave Oscillators" by F. Sterzer and D. E. Nelson in the Proceedings of the I.R.E., vol. 49, No. 4, pages 744–753, April 1961; and "Tunnel Diode—New Electronic Workhorse" in Electronic Industry, August 1959, pages 82 et seq.

One characteristics of a tunnel diode, due to its very broad negative resistance range, is its ability to support oscillation over a very broad frequency range. This, however, has been found to be troublesome in that in many instances it was hard to predict the exact frequency at which the diode would oscillate. As a consequence, elaborate means have been taken to suppress the possibility of oscillation at undesired frequencies by utilizing cavity designs which support only a single mode of oscillation. This control was readily obtainable where the oscillator was to operate at a fixed or permanent frequency. However, the solution to this problem was not readily available where the oscillator was to be tuned over a broad frequency range, especially at frequencies of 6 kmc. and higher.

In order to tune tunnel diodes used for the generation of microwave frequencies, it has been the practice in the past to utilize another characteristic of a tunnel diode, i.e., that of the changing of its oscillating frequency with a change in loading. Thus, in order to tune a cavity wherein a tunnel diode element was disposed, the loading was varied by such means as rotating an output coupling loop disposed within the cavity. This effectuated the tuning of the output frequency of the device but consequently led to the great variation in output power available over the tunable frequency range. Generally, it was the case that the output power substantially and steadily decreased with an increase in the output frequency of the oscillator.

Other means have been used to vary the output frequency of these devices, such as varying the bias voltage applied to the device, however, the tuning range decreased substantially with anything other than very light loading.

From the above consideration it should be evident that the electronic art would be greatly advanced by a semiconductor negative resistance oscillator which would operate without the possibility of oscillation taking place other than at a predetermined frequency and having a substantially constant output power over a very broad frequency and load range.

It is therefore an object of the present invention to provide a tunable negative resistance oscillator which will support only one mode of oscillation over a broad tuning range.

It is another object of the present invention to provide a tunable negative resistance oscillator which presents a substantially constant load to the negative resistant element within the device over the tunable frequency range thereof.

It is still another object of the present invention to provide a tunable negative resistance oscillator which has a substantially constant output power over its tuning range.

Briefly, it may be stated that the invention provides for the tuning of a conical cavity with a minimum of variation in the loading by mechanically varying the cone angle of the cavity. This allows for the distributed susceptance at the input terminals across the negative resistant element to be maintained symmetrical with respect to a coaxial load on the conical cavity. Thus, circumferential modes which may lead to oscillation at undesired frequencies are avoided, while the load, as seen by the negative resistance element, remains substantially constant.

The invention and specific embodiments thereof will be described hereinafter by way of example and with reference to the accompanying drawings, in which.

Figures 1, 3, 4A, 4B:
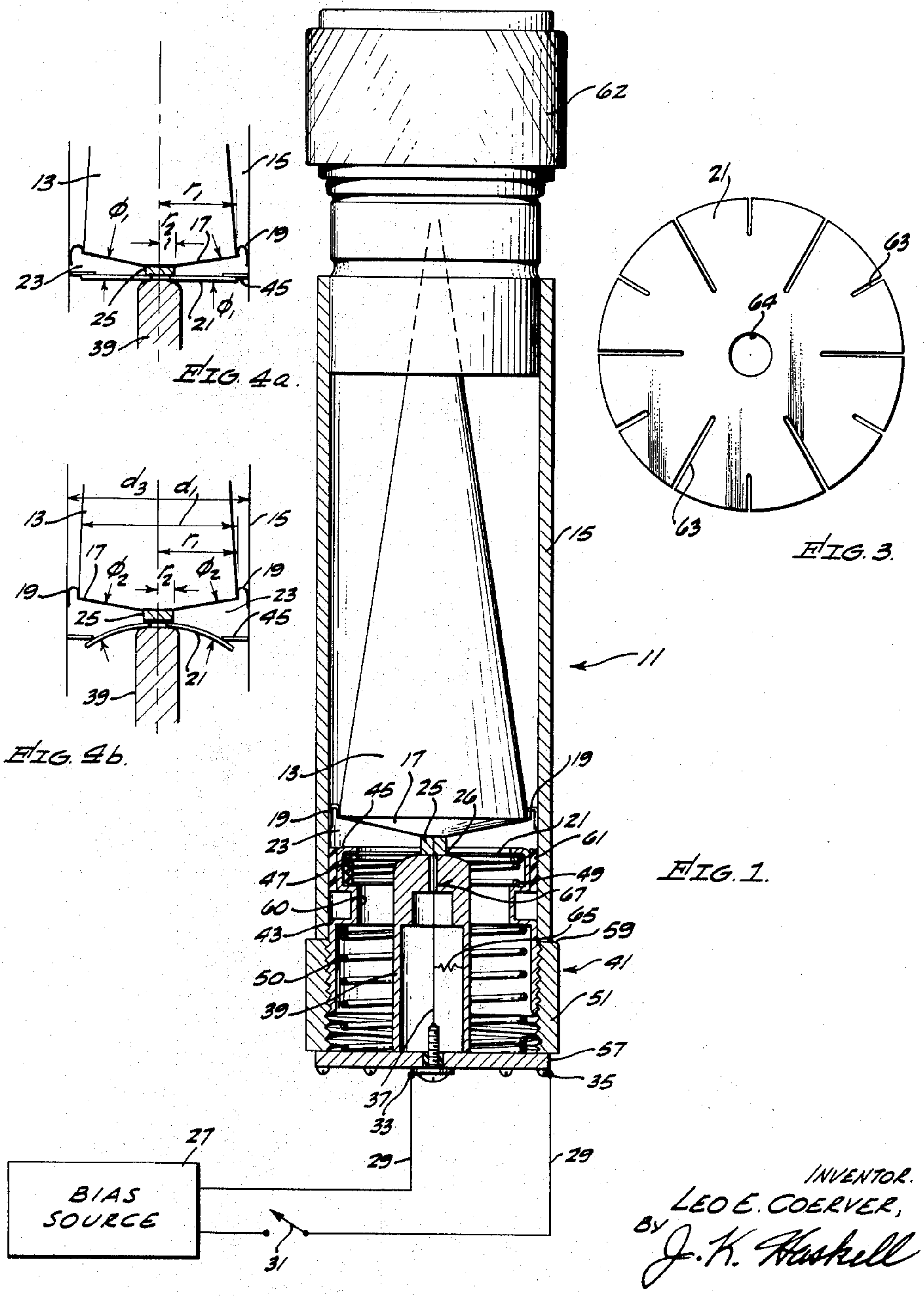
FIGS. 1 and 2 are partial cross-sectional views of a preferred embodiment of the present invention.
FIG. 3 is a plan view of the flexible diaphragm used in the invention.
Figure 5:
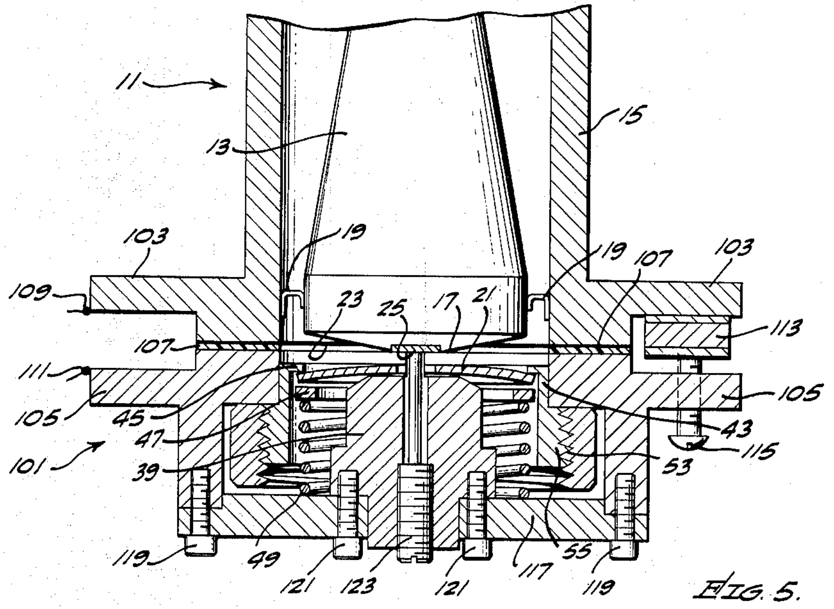
Figure 2:
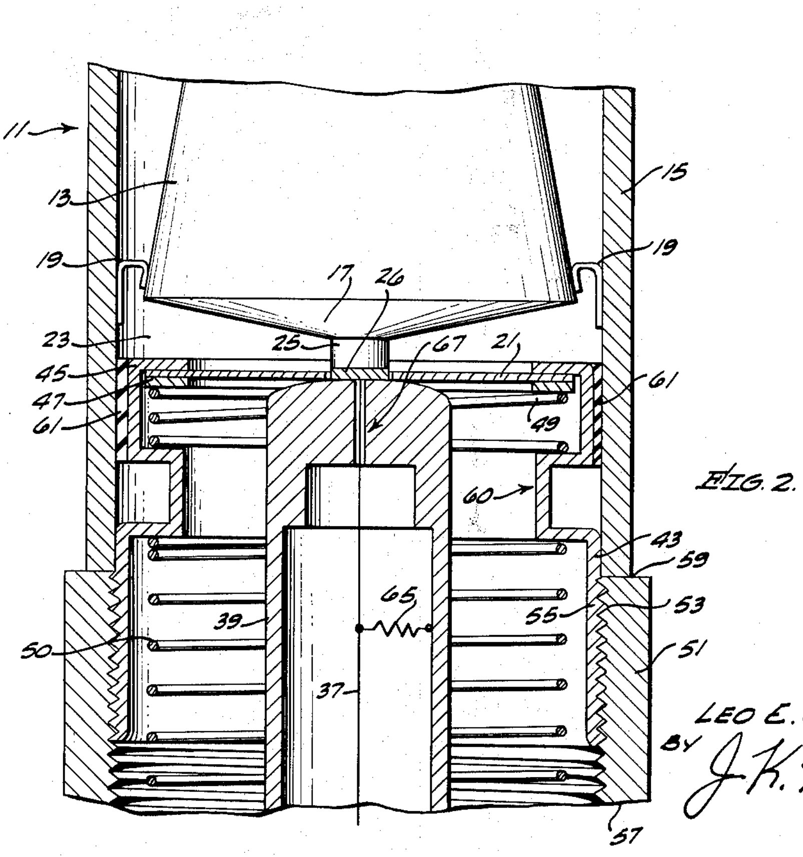
Figure 6:
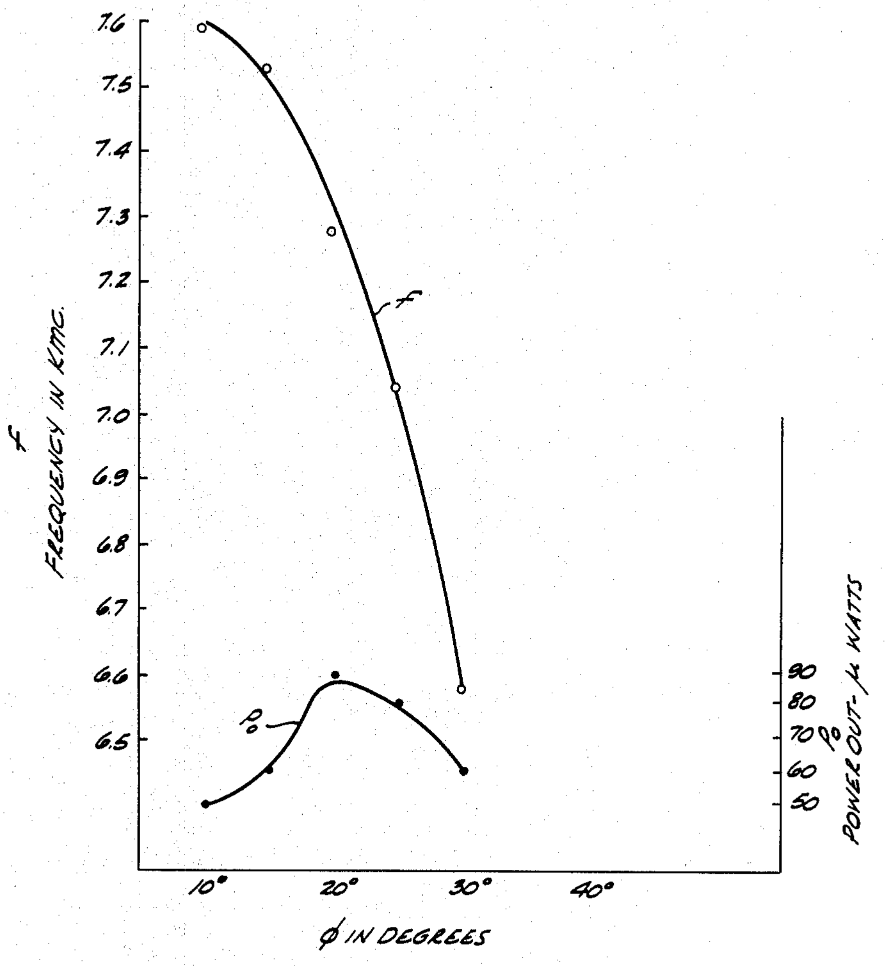
Figures 7, 8:
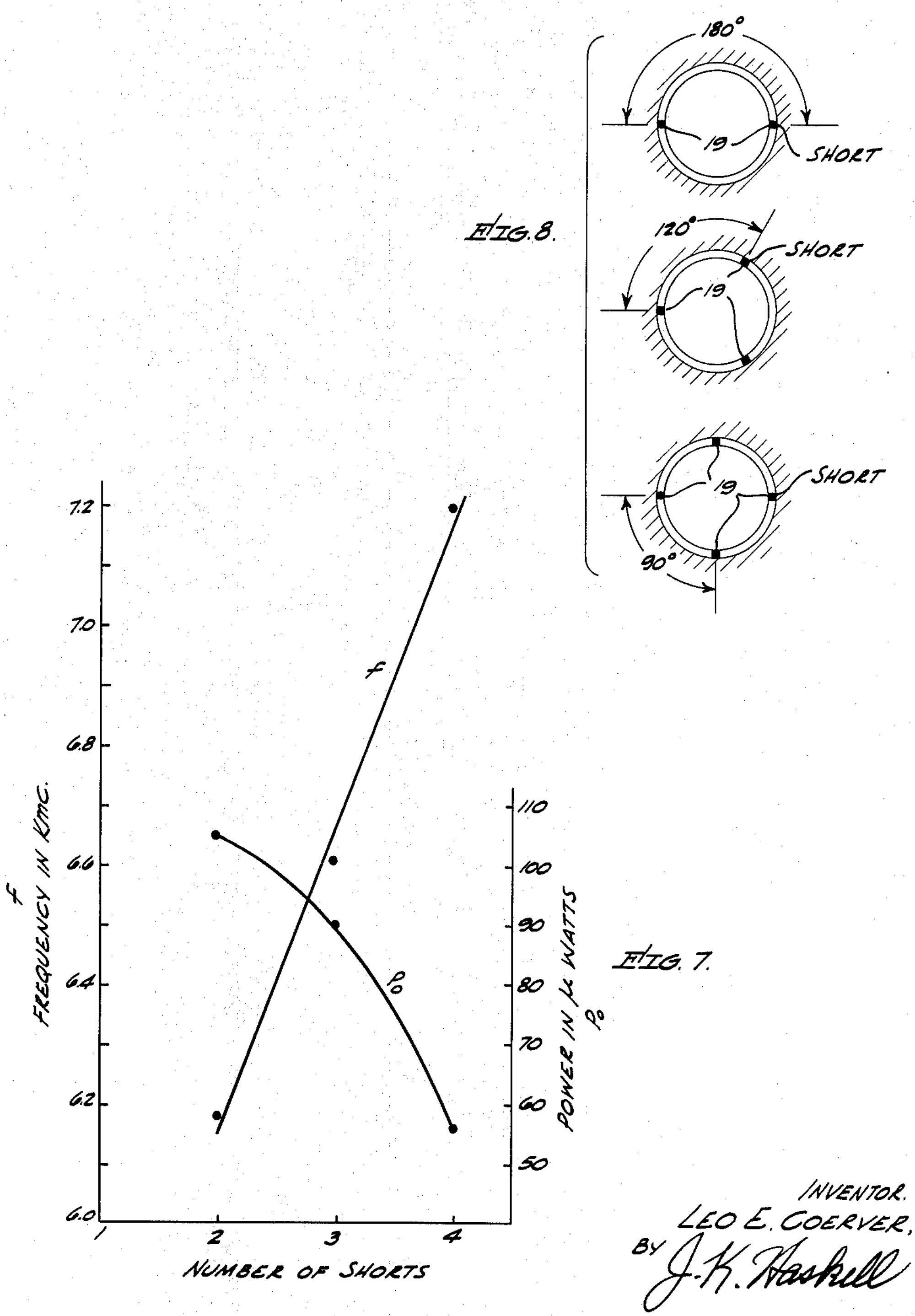

FIGS. 4*a* and 4*b* are partial cross-sectional views of the radial cavity seen in FIGS. 1 and 2;

FIG. 5 is a partial view illustrating a second embodiment of the invention;

FIG. 6 is a graph illustrating output frequency and power with respect to the cavity angle $\phi$ of the device shown in FIG. 5;

FIG. 7 is a graph showing how the output frequency and power varies with the number of shorting elements utilized; and FIG. 8 illustrates the different symmetrical orientations of the shorting elements used in the computation of the data recorded in FIG. 7.

Referring now to the drawings and more particularly to the negative resistance oscillator of FIGS. 1 and 2, there is shown a coaxial transmission line 11 having an inner conductor 13 and an outer conductor 15. The inner conductor 13 has a terminating end surface 17 of convex configuration. Also, there is shown two shorting elements 19 of spring-like conductive material such as beryllium copper disposed between the inner conductor 13 and the outer conductor 15 adjacent the end surface 17. A flexible diaphragm 21 of, for example, beryllium copper material, is disposed within the outer conductor 15 to provide a symmetrical conical cavity 23 between the end surface 17 and the diaphragm 21.

FIGS. 1 and 2 further show a negative resistant element such as tunnel diode 25 disposed within the cavity 23 coaxial with the outer conductor 15. The lower side of the tunnel diode 25 is insulated from the diaphragm 21 by an insulating washer 26. A bias voltage source 27 is shown connected by wires 29 and switch 31 to an insulated center terminal 33 and to a sleeve terminal 35 at the lower part of the transmission line 11. The bias voltage is coupled to the lower side tunnel diode 25 by means of conductor 37 disposed within a hollow pedestal 39; and to the other side of the tunnel diode 25 by means of the outer conductor 15, the shorting elements 19 and the inner conductor 13.

The peripheral dimensions of the cavity 23 may be changed by an adjustable means 41 which is mechanically coupled to the diaphragm 21 and to the end surface 17 of the inner conductor 13. The adjustable means 41 provides for the uniform changing of the distance between the terminating end surface 17 and the periphery of the diaphragm 21 while substantially maintaining the distance between the end surface 17 and the center of the diaphragm 21. The adjustable tuning means 41 includes a piston 43 having a lip portion 45 which engages the outer peripheral edge of the diaphragm 21. A retainer ring 47 and a spring 49 keep the diaphragm 21 in contact with the lip portion 45 of the piston 43. Also, there is provided a spring 50 which helps restore the diaphragm 21 to its original unflexed shape. The fact that the diaphragm 21 is made of a spring material like beryllium copper also helps the diaphragm 21 to return to its unstressed shape when the piston 43 is advanced upward. The piston 43, and consequently the periphery of the diaphragm 21, is moved vertically by twisting knurled nut 51 whose threads 53 engage threads 55 on the outer surface of piston 43. The knurled nut 51 is captivated between the lower retainer section 57 and the upper retainer section 59. The piston 43 is provided with what is known as a quarter wave "open" section 60 to prevent radio frequency energy from propagating between the piston 43 and the outer conductor 15. An insulating band 61 is disposed within the quarter wave open section 60 to maintain the distance between the piston 43 and the outer conductor 15. The radio frequency output power of the oscillator is provided at the coaxial fitting 62 (FIG. 1) coupled to the top portion of the coaxial transmission line 11.

The flexible diaphragm 21 is pictured in FIG. 3. It is radially slotted by slots 63 so as to form an approximately semihemispherical surface when supported at its center by pedestal 39 and its outer periphery is pulled downward by the lip portion 45. The radial slots 63 do not disturb the dominant TEM mode of propagation in the cavity 23 which is in the well known form of a conical transmission line. The diaphragm 21 is also provided with a center hole 64 through which conductor 37 passes for connection to the tunnel diode 25.

The cavity 23 is shown in cross-section in FIGS. 4*a* and 4*b*, and parts corresponding to those shown in FIGS. 1 and 2 bear like reference characters. These figures illustrate how the cavity cross-section is altered to achieve tuning. In these figures, $\phi_2$ is greater than $\phi_1$. Again, it may be seen that cavity 23 is formed by the end surface 17 and the diaphragm 21. The terminations of the cavity 21 are cylindrical areas at radii $r_1$ and $r_2$.

When the angle $\phi$ between the conical surfaces of the transmission line (comprising the end surface 17 and the diaphragm 21) is varied, the total susceptance of a load transformed through the transmission line to its input terminals at radius $r_2$ (across the tunnel diode 25) will also vary. Thus, in FIG. 4*a* an output load at radius $r_1$ will cause a certain susceptance to appear at the input terminals at radius $r_2$. Increasing the angle $\phi$ as in FIG. 4*b* without changing the load at radius $r_1$ decreases the susceptance at the input terminals at radius $r_2$. Thus, a device of constant capacitive susceptance at terminals $r_2$ will resonant at a lower frequency for the situation shown in FIG. 4*b* than for that shown in FIG. 4*a*, even though the load at radius $r_1$ remains constant.

The load in the cavity 23 is maintained constant because the cavity 23 is loaded by a section of coaxial line with one or more symmetrically placed shorting elements 19 along its periphery. The loading is determined by the number of shorting elements 19 and the ratio of $d_3/d_1$ as seen in these figures.

A series connected or stabilizing resistor 65 is mounted within the pedestal 39 and electrically coupled across the tunnel diode 25 by means of the conductor 37 to the lower side of the diode 25 and by means of the pedestal 39, the outer conductor 15, the shorting elements 19 and the inner conductor 13 to the outer side of the diode 25. The resistor 65 is placed in the circuit in order to prevent the inductance of the wires 29 from affecting the performance of the oscillator. The value of the resistor 65 is usually very low, generally in the range of from 2 to 4 ohms.

Also within the pedestal 39, there is provided a quarter wave open section 67 which prevents electromagnetic energy from propagating through the hollow portion of the pedestal 39.

FIG. 5 illustrates another embodiment of the invention. Here, parts corresponding to those of the embodiment of FIGS. 1 and 2 bear like reference characters.

Unlike the first embodiment shown, the negative resistance oscillator of FIG. 5 has a separate tuning section 101 which is mechanically coupled to the outer conductor 15 of the transmission line 11 by means of an upper flange 103 and a lower flange 105 and non-conducting nylon machine screws (not shown). A thin insulating ring 107 of, for example, mica material, is disposed between the tuning section 101 and the transmission line 11 to electrically insulate the two parts. Here, the bias voltage from the source 27 is coupled to the tunnel diode 25 by means of wires 29 and switch 31 to terminals 109 and 111 attached to the upper and lower flanges, respectively.

A stabilizing resistor 113 is positioned between the two flanges 103 and 105 by means of a conductive machine screw 115 threadedly engaged to the lower flange 105.

The spring 49 and the pedestal 39 are retained within the tuning section 101 by a retainer bar 117 which is affixed by machine screws 119. Screws 121 hold the pedestal 39 to the retainer bar 117 and a tunnel diode mounting screw 123 is threadedly engaged to the pedestal 39 so as to provide electrical contact to the diode 25 for bias voltage purposes.

For the embodiment of the invention as shown in FIG. 5 and from which the data compiled for the graph of FIG. 6 was obtained, the following dimensions have been used (see FIG. 4*b*):

$d_1$=0.405 inch
$d_3$=0.465 inch
$r_1=d_1/2$
$r_2$=0.082 inch

For operation at other frequencies, reference may be made to the articles cited above and to texts on the subject such as "Fields and Waves in Modern Radio" by S. Ramo and J. R. Whinnery, John Wiley & Sons, Inc., N.Y., 1953, at pages 438–439.

The output frequency and power characteristics of the device of FIG. 5 with respect to the angle $\phi$ is given in the graph of FIG. 6. As can be seen, the output frequency of the oscillator decreases with an increase of the angle $\phi$. Unlike prior art devices where the output power steadily decreases with increase of frequency, FIG. 6 shows that the output power of the device according to the invention, although not absolutely constant, is substantially so since it varies only a small amount over the entire tuning range, in this case 1,000 mc.

The number of shorting elements 19, as stated before, determines the fixed loading on the device. Accordingly, it will be expected that the number of such shorting elements 19 should affect the frequency of the operation of the oscillator. This is shown by the graph in FIG. 7. This figure also indicates that the output power of the oscillator varies inversely with an increase in the number of shorting elements 19. The symmetrical orientation of the various numbers of shorting elements 19 is shown in FIG. 8.

From the foregoing, it can be seen that there is achieved a stable negative resistance oscillator which oscillates with substantially constant output power over a broad frequency range.

Although only two specific embodiments of the invention have been herein illustrated, it should be apparent that other organizations of the specific embodiments shown may be made and other materials than those specified may be used within the spirit and scope of the invention.

Accordingly, it is intended that the foregoing disclosure and the showings made in the drawings shall be considered only as illustrations of the principles of this invention and are not to be construed in a limiting sense.

What is claimed is:

1. A tunable negative resistance oscillator comprising: a coaxial transmission line for propagating electromagnetic energy, said transmission line having an inner and outer conductor, said inner conductor having a transverse terminating end surface of convex configuration extending adjacent to but not in contact with said outer conductor; at least one discrete shorting element disposed between said inner and outer conductors adjacent said terminating end surface; a flexible diaphragm disposed within said outer conductor to provide a symmetrical conical cavity between said terminating end surface and said diaphragm; a negative resistance element disposed within said cavity coaxial with said outer conductor; conductive bias and load means coupled to said negative resistance element for providing a predetermined bias voltage to said negative resistance element; and adjustable tuning means mechanically coupled to said diaphragm and to said outer conductor for uniformly changing the distance between said terminating end surface and the periphery of said diaphragm while substantially maintaining the distance between said terminating end surface and the center of said diaphragm.

2. A tunable negative resistance oscillator comprising: a coaxial transmission line for propagating electromagnetic energy, said transmission line having an inner and outer conductor, said inner conductor having a transverse terminating end surface of convex configuration extending adjacent to but not in contact with said outer conductor and having a negative resistance element contiguous and coaxial with said terminating end surface; at least one discrete shorting element disposed between said inner and outer conductors adjacent said terminating end surface; a sleeve member slidably engaged within said outer conductor and having an end section of reduced inner diameter; a flexible diaphragm mounted within said sleeve member and engaging at its periphery said reduced end section to provide a symmetrical conical cavity between said terminating end surface and said diaphragm; insulated conducting means electrically connected to said negative resistance element for applying a bias voltage thereto; and means for applying and maintaining a controllable force along the axis of said transmission line to said diaphragm.

3. A tunable negative resistance oscillator structure comprising: a coaxial transmission line for propagating electromagnetic energy, said transmission line having a longitudinal axis and an inner and an outer conductor about said axis, said inner conductor having a transverse convex terminating end surface extending adjacent to but not in contact with said outer conductor and having a negative resistance element contiguous and coaxial with said terminating end surface; at least one discrete shorting element disposed between said inner and outer conductors adjacent said terminating end surface; a flexible diaphragm disposed within said outer conductor essentially in a plane perpendicular to said axis to provide a conical cavity between said terminating end surface and said diaphragm; conductive bias and load means connected to said negative resistance element and electrically insulated from said inner conductor for providing a predetermined bias voltage to said negative resistance element; and adjustable tuning means mechanically coupled to said diaphragm and to said outer conductor for uniformly changing the distance between said terminating end surface and the periphery of said diaphragm while substantially maintaining the distance between said terminating end surface and the center of said diaphragm.

4. A tunable negative resistance oscillator comprising: a coaxial transmission line for propagating electromagnetic energy, said transmission line having an inner and outer conductor, said inner conductor having a transverse terminating end surface of convex configuration extending adjacent to but not in contact with said outer conductor; at least one discrete shorting element disposed between said inner and outer conductors adjacent said terminating end surface; a second outer conductor coaxial with and juxtaposed said first mentioned outer conductor; a sleeve member slidably engaged within the second mentioned outer conductor and having an end section of reduced inner diameter; a flexible diaphragm disposed within said sleeve member and engaging at its periphery said reduced end section to provide a symmetrical conical cavity between said terminating end surface and said diaphragm; a tunnel diode disposed within said cavity coaxial with said outer conductors; conductive bias and load means connected to said tunnel diode for providing a predetermined voltage bias to said tunnel diode; and means for applying and maintaining a controllable force along the axis of said coaxial line to said diaphragm.

References Cited by the Examiner

UNITED STATES PATENTS 3,121,205 2/1964 Foss ............... 333—83

OTHER REFERENCES

Applications of Tunnel Diodes: Hines et al., Digest of Technical Papers Presented at the 1960 International Solid-State Circuits Conference, Feb. 10, 1960, pp. 12, 13.

ROY LAKE, *Primary Examiner.*

JOHN KOMINSKI, *Examiner.*